(12) United States Patent
Barth et al.

(10) Patent No.: US 6,960,835 B2
(45) Date of Patent: Nov. 1, 2005

(54) STRESS-RELIEF LAYER FOR SEMICONDUCTOR APPLICATIONS

(75) Inventors: Hans-Joachim Barth, Munich (DE); Erdem Kaltalioglu, Fishkill, NY (US); Mark D. Hoinkis, Fishkill, NY (US); Gerald R. Friese, Munich (DE); Pak Leung, Cedar Park, TX (US)

(73) Assignees: Infineon Technologies AG, Munich (DE); United Microelectronics Co., Hsin-Chu (TW)

( * ) Notice: Subject to any disclaimer, the term of this patent is extended or adjusted under 35 U.S.C. 154(b) by 0 days.

(21) Appl. No.: 10/698,057

(22) Filed: Oct. 30, 2003

(65) Prior Publication Data

US 2005/0093159 A1 May 5, 2005

(51) Int. Cl.[7] .................... H01L 23/48; H01L 21/4763
(52) U.S. Cl. .................... 257/758; 257/635; 438/622
(58) Field of Search .......................... 257/758, 762, 257/529, 635; 438/622

(56) References Cited

U.S. PATENT DOCUMENTS

2004/0227214 A1 * 11/2004 Hoinkis et al. ............. 257/635

* cited by examiner

Primary Examiner—Mark V. Prenty
(74) Attorney, Agent, or Firm—Brinks Hofer Gilson & Lione

(57) ABSTRACT

In a semiconductor integrated circuit device, thermo-mechanical stresses on the vias can be reduced by introducing a stress relief layer between the vias and a hard dielectric layer that overlies the vias.

27 Claims, 3 Drawing Sheets

STRESS-RELIEF LAYER FOR SEMICONDUCTOR APPLICATIONS

FIELD OF THE INVENTION

The invention relates generally to semiconductor manufacturing and, more particularly, to a stress-relief layer for semiconductor applications.

BACKGROUND OF THE INVENTION

As semiconductor wafers progress to higher density chips with shrinking geometries, the materials and processes used in wafer fabrication are changing. At the same time, some chips have literally tens of billions of electrical connections between the various metal layers and silicon devices. Electrical performance is improved though concurrent scaling of device features. An indicator of chip performance is the speed at which signals are transmitted. Decreased geometries translate into reduced interconnect linewidths which in turn lead to increased resistance ("R"). Furthermore, reduced spacing between conductor lines creates more parasitic line capacitance ("C"). One result is an increase in RC signal delay. The line capacitance is directly proportional to the k-value of the dielectric. Therefore, new materials are needed to compensate for these phenomena and still maintain electrical performance. New metal conductor materials, such as copper ("Cu"), and new low-k insulating dielectric materials, such as silicon low-k ("SiLK"), have been introduced. Copper can provide reduced resistivity over the traditionally used aluminum ("Al"). Low-k materials can provide reduced line capacitance over the traditionally used silicon dioxide ("$SiO_2$").

Multiple conductive and insulating layers are required to enable the interconnection and isolation of devices on different layers. The interlayer dielectric ("ILD") serves as an insulator material between each metal layer or between a first metal layer and the wafer. ILDs can be made of a low-k insulating material, such as SiLK. ILDs have many small vias, which are openings in the ILD that provide an electrical pathway from one metal layer to an adjacent metal layer. Metal layers can be made of copper. Vias are filled with a conductive metal, traditionally tungsten and more recently copper.

In Cu/low-k interconnect architectures, the connecting vias between metal layers are subject to significant mechanical stresses that can result in, for example, via resistance increases. This is particularly true when Cu lines are embedded in a "soft" low-k dielectric, such as SiLK, and the final, or any intermediate, Cu metal layer on top is then covered or embedded in a "hard" dielectric layer, such as oxide or fluorosilicate glass ("FSG"). Under stress, cracks can form in the "hard" dielectric. These cracks can open the dielectric to environmental contamination, such as oxygen and moisture diffusion.

It is therefore desirable to provide a solution that can reduce the thermo-mechanical stress on vias and reduce cracking in the hard dielectric. Exemplary embodiments of the present invention can provide this by introducing a stress-relief layer between the vias and the hard dielectric layer. Such a stress-relief layer can, in some embodiments, include a "soft" dielectric material, such as a low-k insulating material.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of silicon low-k ("SiLK") dielectric material, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention can reduce the thermo-mechanical stress on vias and reduce cracking in the hard dielectric. Exemplary embodiments of the present invention can provide this by introducing a stress-relief layer between the vias and the hard dielectric layer. Such a stress-relief layer can include a "soft" dielectric material, such as a low-k insulating material.

FIGS. 1–3D are provided for illustrative purposes, and the various features therein are not necessarily shown to scale.

Figure 1:
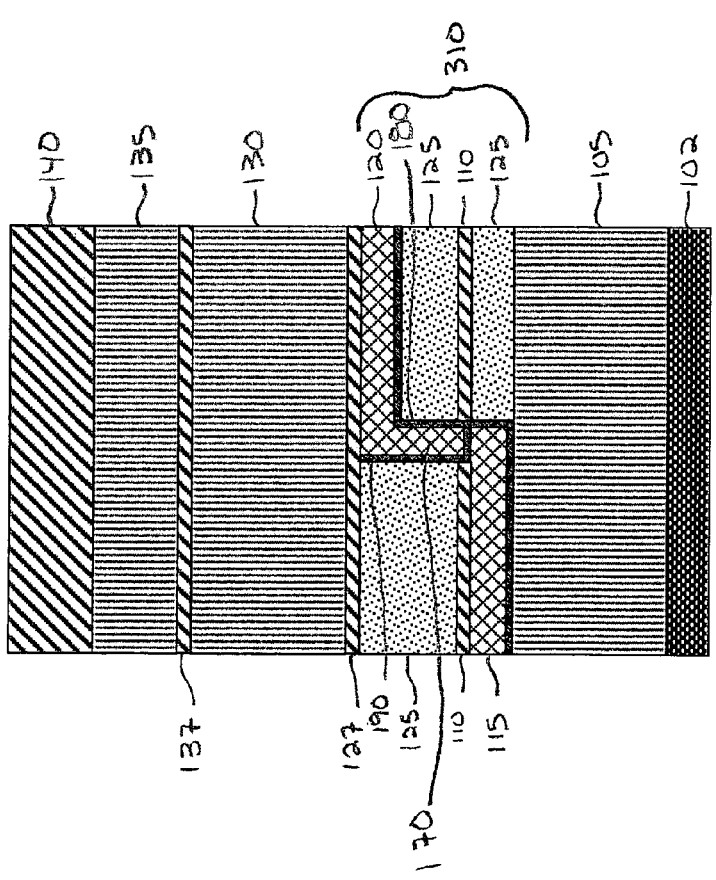
FIG. 1 diagrammatically illustrates a conventional embodiment of semiconductor interconnect architecture in accordance with the known art.

FIG. 1 diagrammatically illustrates an example of semiconductor interconnect architecture in accordance with the known art. The topmost layers, 105–140, are shown on top of block 102 which represents all previous layers. The first of the topmost layers, 105, functions as a local interconnect and is conventionally made of an oxide. On top of layer 105, interlayer dielectric ("ILD") 125 has been deposited, patterned and etched to enable embedding of interconnect metals 115 and 120. ILD 125 may be made of a soft, low-k material, such as silicon low-k ("SiLK"). Layer 110, through ILD 125 between interconnect metals 115 and 120, can function as a cap layer. Layer 127, which can function as a cap layer, covers the previous layers, followed by hard dielectric 130. Hard dielectric 130 is covered by layer 137, which can function as a cap layer. Layer 137 is covered by hard dielectric passivation layers 135 and 140, in that order. Passivation layer 135 may be an oxide. Passivation layer 140 may be a nitride. Vias at 170 are formed between side liners at 180 and 190.

Figure 2:
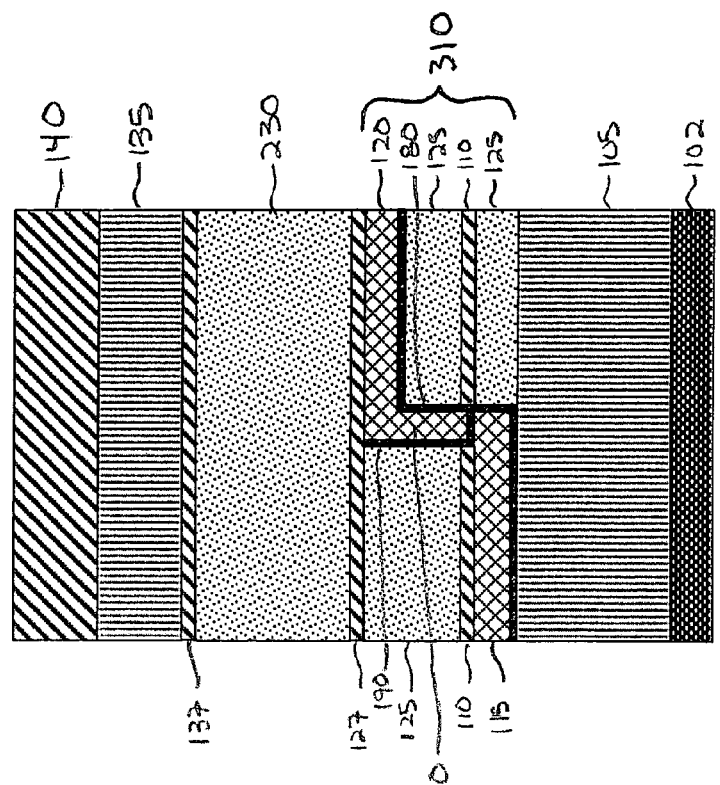
FIG. 2 diagrammatically illustrates an exemplary embodiment of semiconductor interconnect architecture in accordance with the present invention.

Because of copper corrosion and mechanical packaging issues, when the last interconnect metal layers, such as layers 115 and 120, are made of copper, either the subsequent layers must be a hard dielectric material, such as an oxide or an oxide/nitride combination, (as illustrated in FIG. 1) or the last metal layer may be embedded in a hard dielectric material, such as oxide or fluorosilicate glass ("FSG"). In a conventional interconnect architecture, such as illustrated by FIG. 1, when vias, such as via 170 in ILD 125, are subjected to compressive stresses, cracks can form through hard dielectric 130 and hard dielectric passivation layers 135 and 140. To reduce these stresses, hard dielectric 130 can be replaced with a soft dielectric, such as a low-k material (e.g., SiLK) that can function as a buffer layer, in accordance with exemplary embodiments of the present invention. This is illustrated in FIG. 2, wherein soft dielectric 230 is positioned between layers 127 and 137. In some exemplary embodiments of the present invention, the depth of soft dielectric 230 may be less than or equal to one half of the depth of the intended covering or passivation layer(s), such as hard dielectric passivation layers 135 and 140. The soft dielectric is more flexible than the hard dielectric layers 135 and 140, thereby better accommodating thermo-mechanical stresses.

FIGS. 3A–D diagrammatically illustrate exemplary embodiments of semiconductor interconnect architecture in accordance with the present invention. In each of the exemplary embodiments illustrated by FIGS. 3A–D, soft dielectric layer 230 (e.g., a low-k material, such as SiLK) can be interposed between a structure 310 (e.g., Cu in SiLK) and a protective hard dielectric material or combination of materials. In FIGS. 3A–D, structure 310 can be deposited on layers 102 and 105 and cap layer 127 can be deposited on structure 310. In some exemplary embodiments, the cap layer can be made of silicon nitride ("SiN").

Figure 3B:
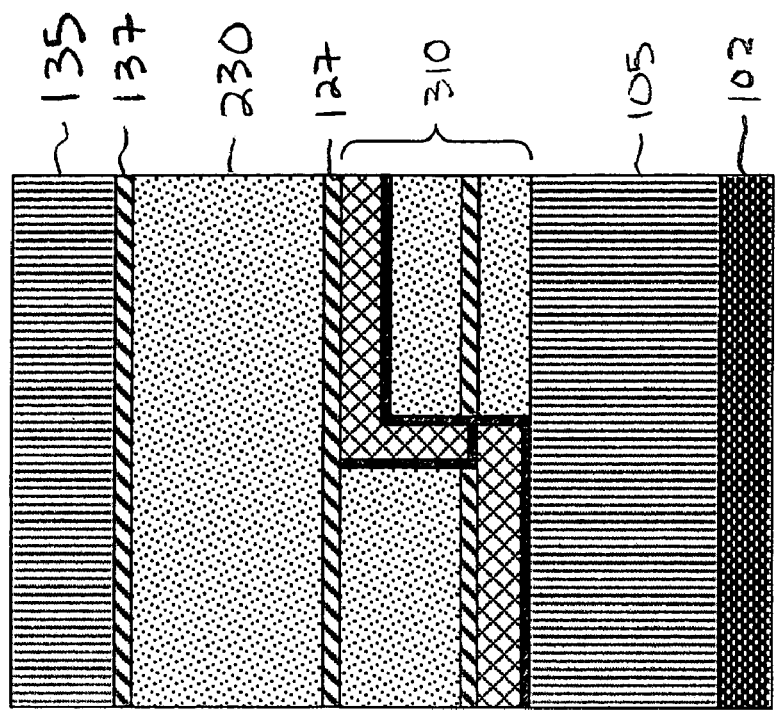
FIGS. 3A–D diagrammatically illustrate exemplary embodiments of semiconductor interconnect architecture in accordance with the present invention.
Figure 3A:
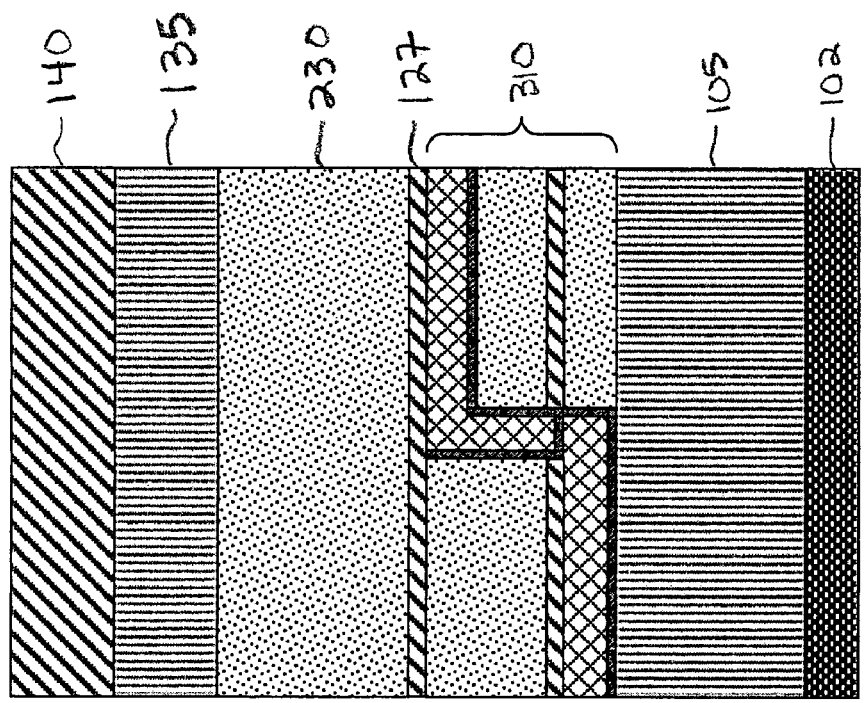

In the exemplary embodiments illustrated by FIGS. 3A and 3B, soft dielectric 230 can be deposited on cap layer 127. In some exemplary embodiments, soft dielectric 230 can be a low-k material, such as SiLK. In the exemplary embodiment illustrated by FIG. 3A, soft dielectric 230 can be covered by a hard dielectric including hard dielectric passivation layers 135 and 140. In some exemplary embodiments, layer 135 may be an oxide. In some exemplary embodiments, layer 140 may be a nitride. In the exemplary embodiment illustrated by FIG. 3B, soft dielectric 230 can be covered by cap layer 137 and hard dielectric 135 can be deposited on cap layer 137. In some exemplary embodiments, cap layer 137 can be SiN.

Figure 3D:
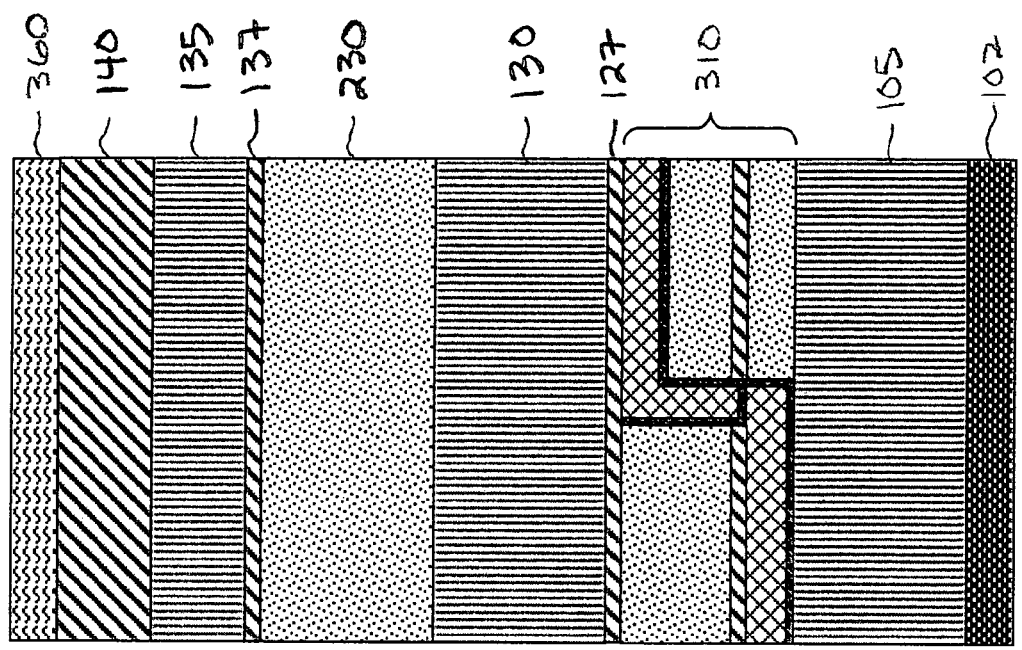
Figure 3C:
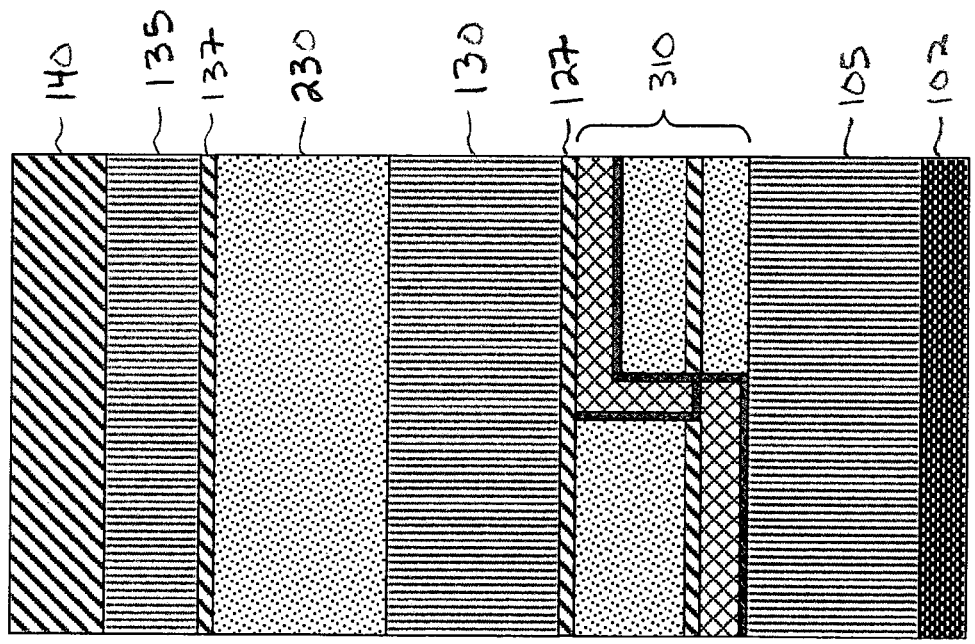

In the exemplary embodiments illustrated by FIGS. 3C and 3D, hard dielectric 130 (e.g., an oxide layer) can be deposited on cap layer 127, followed successively by soft dielectric 230, cap layer 137 (optionally), and hard dielectric passivation layers 135 and 140. Additionally, as illustrated in the exemplary embodiment of FIG. 3D, metallic laser fuse 360 can be deposited on hard dielectric passivation layer 140. In some exemplary embodiments, metallic laser fuse 360 may be aluminum or copper. The exemplary embodiment illustrated by FIG. 3D may provide added protection against damage or cracks induced by laser fusing.

Although exemplary embodiments of the present invention have been described in detail, it will be understood by those skilled in the art that various modifications can be made therein without departing from the spirit and scope of the invention as set forth in the appended claims.

What is claimed is:

1. A semiconductor integrated circuit apparatus, comprising:
    a plurality of electrically conductive vias for electrically connecting metal layers of said apparatus;
    a first dielectric layer overlying said vias;
    a stress relief layer that is more flexible than said first dielectric layer, said stress relief layer overlying said vias and interposed between said vias and said first dielectric layer; and
    a further dielectric layer that is less flexible than said stress relief layer, said further dielectric layer overlying said vias and interposed between said vias and said stress relief layer.

2. The apparatus of claim 1, wherein said first dielectric layer includes a layer of a first dielectric material and a layer of a second dielectric material overlying said layer of first dielectric material.

3. The apparatus of claim 2, wherein said first dielectric material is an oxide material and said second dielectric material is a nitride material.

4. The apparatus of claim 1, including a cap layer overlying said vias and interposed between said vias and said further dielectric layer.

5. The apparatus of claim 1, wherein said further dielectric layer is an oxide layer.

6. The apparatus of claim 1, including a metallic laser fuse layer overlying said dielectric layer.

7. The apparatus of claim 7, wherein said dielectric layer includes a layer of a first dielectric material and a layer of a second dielectric material overlying said layer 5 of first dielectric material.

8. The apparatus of claim 6, wherein said metallic fuse layer is one of aluminum and copper.

9. The apparatus of claim 1, wherein said stress relief layer includes a further dielectric layer.

10. The apparatus of claim 9, wherein said further dielectric layer includes a low-k material.

11. The apparatus of claim 10, wherein said low k material is a silicon low k material.

12. The apparatus of claim 1, wherein said first dielectric layer includes one 15 of an oxide layer and a nitride layer.

13. The apparatus of claim 1, wherein a thickness of said stress relief layer is approximately half of a thickness of said first dielectric layer.

14. The apparatus of claim 1, wherein a thickness of said stress relief layer is less than half of a thickness of said first dielectric layer.

15. The apparatus of claim 1, including a further dielectric layer underlying said stress relief layer, wherein said further dielectric layer is more flexible than said first dielectric layer, and wherein said vias are embedded in said further dielectric layer.

16. The apparatus of claim 1, wherein said vias are copper vias.

17. The apparatus of claim 1, including a first cap layer overlying said vias and interposed between said vias and said stress relief layer.

18. The apparatus of claim 17, including a further cap layer overlying said stress relief layer and interposed between said stress relief layer and said first dielectric layer.

19. The apparatus of claim 18, wherein said first dielectric layer includes a layer of a first dielectric material and a layer of a second dielectric material overlying said layer of first dielectric material.

20. The apparatus of claim 18, including a further dielectric layer that is less flexible than said stress relief layer, said further dielectric layer overlying said vias and interposed between said first cap layer and said stress relief layer.

21. The apparatus of claim 18, including a metallic laser fuse layer overlying said first dielectric layer.

22. A method of making a semiconductor integrated circuit, comprising:
    providing a plurality of electrically conductive vias for electrically connecting metal layers of the integrated circuit;
    providing in overlying relationship relative to the vias a first dielectric layer;
    providing, in overlying relationship relative to the vias and interposed between the first dielectric layer and the vias, a stress relief layer that is more flexible than the first dielectric layer; and providing, in overlying relationship relative to the vias and interposed between the vias and the stress relief layer, a further dielectric layer that is less flexible than the stress relief layer.

23. The method of claim 22, wherein said step of providing a stress relief layer includes providing the stress relief layer with a thickness that is approximately half of a thickness of the first dielectric layer.

24. The method of claim 22, wherein said step of providing a stress relief layer includes providing the stress relief layer with a thickness that is less than half of a to thickness of the first dielectric layer.

25. The method of claim 22, wherein said step of providing a first dielectric layer includes providing a layer of a first dielectric material in overlying relationship relative to a layer of a second dielectric material.

26. The method of claim 22, wherein said step of providing a stress relief layer includes providing a further dielectric layer.

27. The method of claim 26, wherein said step of providing a further dielectric layer includes providing a layer of low-k material.

* * * * *